US010720534B2

(12) United States Patent
Tomita

(10) Patent No.: US 10,720,534 B2
(45) Date of Patent: Jul. 21, 2020

(54) PRESSURE SENSOR AND PRESSURE SENSOR MODULE

(71) Applicant: Fujikura Ltd., Tokyo (JP)

(72) Inventor: Michikazu Tomita, Sakura (JP)

(73) Assignee: FUJIKURA LTD., Tokyo (JP)

( * ) Notice: Subject to any disclaimer, the term of this patent is extended or adjusted under 35 U.S.C. 154(b) by 57 days.

(21) Appl. No.: 15/538,374

(22) PCT Filed: Oct. 29, 2015

(86) PCT No.: PCT/JP2015/080542
§ 371 (c)(1),
(2) Date: Jun. 21, 2017

(87) PCT Pub. No.: WO2016/103907
PCT Pub. Date: Jun. 30, 2016

(65) Prior Publication Data
US 2017/0345949 A1  Nov. 30, 2017

(30) Foreign Application Priority Data

Dec. 24, 2014 (JP) ................................ 2014-260405

(51) Int. Cl.
*H01L 29/84* (2006.01)
*G01L 9/00* (2006.01)
(Continued)

(52) U.S. Cl.
CPC ............... *H01L 29/84* (2013.01); *G01L 9/00* (2013.01); *G01L 19/0069* (2013.01); *G01L 19/0654* (2013.01)

(58) Field of Classification Search
CPC ... G01L 19/0654; G01L 19/0069; G01L 9/00; H01L 29/84
See application file for complete search history.

(56) References Cited

U.S. PATENT DOCUMENTS 5,635,764 A * 6/1997 Fujikawa ............ H01L 23/4924
257/766
5,773,775 A * 6/1998 Azema ..................... H01H 3/00
200/61.08
(Continued)

FOREIGN PATENT DOCUMENTS

CN          1461053 A     12/2003
CN          1633587 A      6/2005
(Continued)

OTHER PUBLICATIONS

Notice of Allowance dated Nov. 7, 2017, issued in counterpart Japanese Application No. 2016-565997. (3 pages).
(Continued)

*Primary Examiner* — Randy W Gibson
*Assistant Examiner* — Gedeon M Kidanu
(74) *Attorney, Agent, or Firm* — Westerman, Hattori, Daniels & Adrian, LLP

(57) ABSTRACT

A pressure sensor includes a base including an accommodation portion, a pressure sensor element disposed in the accommodation portion, and a lead portion electrically-connected to the pressure sensor element, including a terminal portion provided along a lower surface of the base, and being exposed to an outside of the base, where the terminal portion includes a recessed groove portion provided on a second surface which is an opposite surface of a first surface facing the body, and where the recessed groove portion divides at the second surface, a first region including a tip of the terminal portion and a second region next to the first region and away from the tip of the terminal portion.

8 Claims, 7 Drawing Sheets

(51) Int. Cl.
*G01L 19/06* (2006.01)
*G01L 19/00* (2006.01)

(56) References Cited

U.S. PATENT DOCUMENTS

| | | | | |
|---|---|---|---|---|
| 6,457,368 | B1* | 10/2002 | Sasaki | G01L 19/0084 73/753 |
| 2003/0115967 | A1 | 6/2003 | Kuhnt et al. | |
| 2003/0214026 | A1 | 11/2003 | Tokuhara | |
| 2005/0061080 | A1* | 3/2005 | Sasaki | G01D 11/245 73/754 |
| 2006/0164203 | A1* | 7/2006 | Mast | G01L 19/003 338/68 |
| 2007/0034997 | A1* | 2/2007 | Bauer | H01L 23/49524 257/676 |
| 2008/0122051 | A1* | 5/2008 | Theuss | H01L 23/49861 257/678 |
| 2008/0223142 | A1* | 9/2008 | Iimori | G01L 9/0051 73/726 |
| 2009/0026560 | A1* | 1/2009 | Wombacher | H01L 23/055 257/415 |
| 2009/0314095 | A1* | 12/2009 | Lu | G01L 19/141 73/727 |
| 2010/0102437 | A1* | 4/2010 | Suto | H01L 24/97 257/692 |
| 2010/0295140 | A1* | 11/2010 | Theuss | B82Y 25/00 257/421 |
| 2011/0016981 | A1* | 1/2011 | Gebauer | G01L 19/0084 73/753 |
| 2012/0106085 | A1* | 5/2012 | Yamazaki | G01J 5/029 361/705 |
| 2012/0164775 | A1* | 6/2012 | Baldo | B81B 7/0061 438/51 |
| 2014/0001578 | A1* | 1/2014 | Walchli | G01L 21/12 257/415 |
| 2014/0260648 | A1* | 9/2014 | Aoyama | G01L 19/0046 73/725 |
| 2015/0090030 | A1* | 4/2015 | Theuss | H01L 23/04 73/431 |
| 2015/0128715 | A1* | 5/2015 | Kamimura | G01L 19/0084 73/754 |
| 2016/0069765 | A1* | 3/2016 | Ishikawa | G01L 9/0051 73/431 |
| 2016/0209284 | A1* | 7/2016 | Takayama | G01L 9/0051 |
| 2018/0238928 | A1* | 8/2018 | Ueno | G01P 1/023 |

FOREIGN PATENT DOCUMENTS

| | | |
|---|---|---|
| CN | 104395722 A | 3/2015 |
| EP | 1970686 A2 | 9/2008 |
| EP | 2 801 805 A1 | 11/2014 |
| JP | 6-7078 B2 | 1/1994 |
| JP | 10-200361 A | 7/1998 |
| JP | 3372548 B2 | 2/2003 |
| JP | 2008-180898 A | 8/2008 |
| TW | I380413 B | 12/2012 |
| TW | 201341773 A | 10/2013 |
| TW | 201447251 A | 12/2014 |
| WO | 2009/119349 A1 | 10/2009 |
| WO | 2013/179871 A1 | 12/2013 |
| WO | 2014/102121 A1 | 7/2014 |

OTHER PUBLICATIONS

Extended (supplementary) European Search Report dated Jul. 26, 2018, issued in counterpart European Application No. 15872476.5. (8 pages).

Office Action dated Dec. 29, 2018, issued in counterpart Chinese Application No. 201580069382.6. (7 pages).

International Search Report dated Nov. 24, 2015, issued in counterpart International Application No. PCT/JP2015/080542 (1 page).

Office Action dated Sep. 19, 2016, issued in counterpart Taiwanese Patent Application No. 104136210 (3 pages).

* cited by examiner

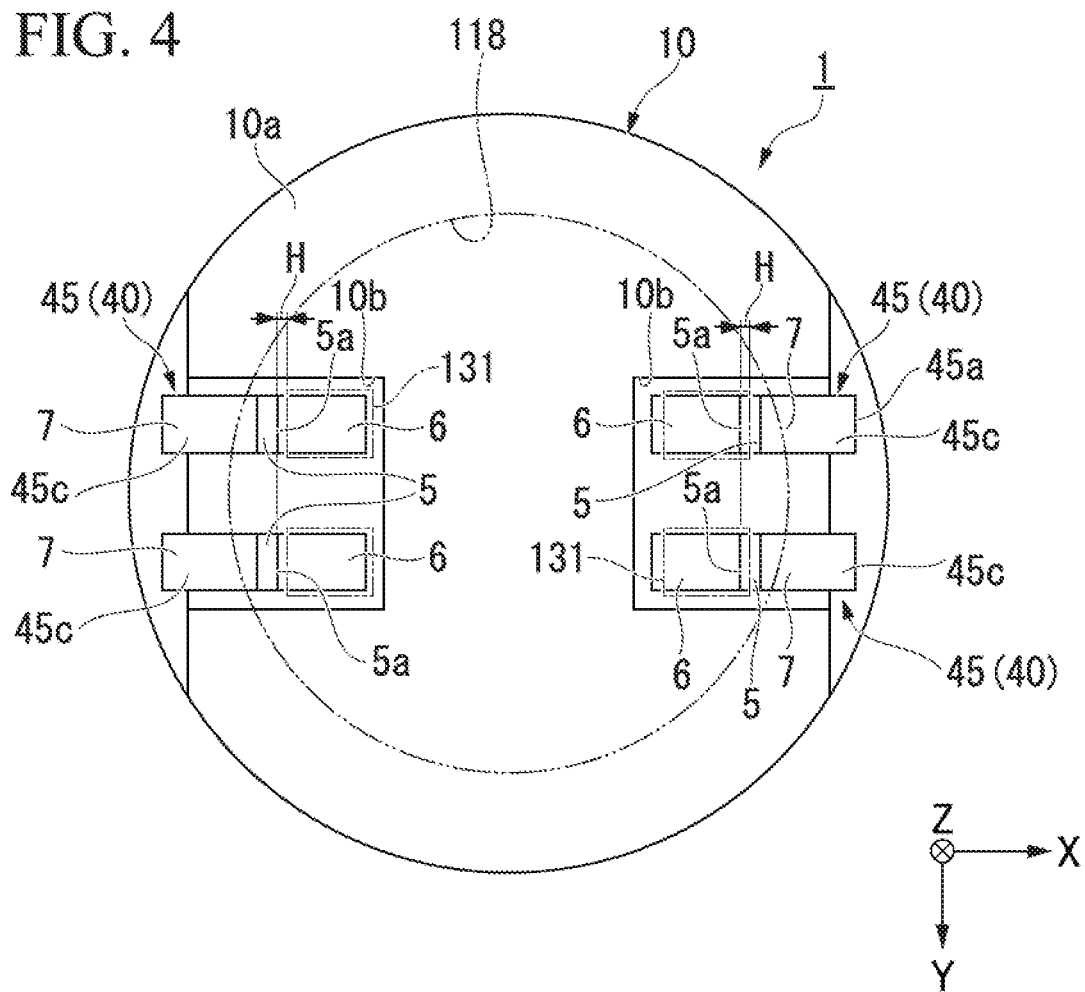

ved the pressure sensor is prevented from spreading to the second region. Therefore, it is possible to

PRESSURE SENSOR AND PRESSURE SENSOR MODULE

CROSS REFERENCES TO RELATED APPLICATIONS

The present application claims priority under 35 U.S.C. § 119 to Japanese Patent Application 2014-260405, filed Dec. 24, 2014. The contents of this application are incorporated herein by reference in their entirety.

TECHNICAL FIELD

The present invention relates to a pressure sensor and a pressure sensor module.

BACKGROUND ART

In portable devices and the like, a semiconductor pressure sensor (hereinafter, simply referred to as a pressure sensor) utilizing a technique of Micro Electro-Mechanical Systems (MEMS) is used. A pressure sensor of this type includes, for example, a pressure sensor element, a control element which receives a signal from the pressure sensor element, a lead frame electrically connected to the pressure sensor element and the control element, a base which molds the control element. In recent years, a portable device such as a mobile phone is required to have a waterproof function, and when incorporating the pressure sensor into the portable device, a structure that prevents water from entering a housing of the portable device from a portion where the pressure sensor is incorporated is needed.

As a structure for preventing entry of water, a structure is known that includes a housing, a pressure sensor incorporated into the housing, and a cover which covers the pressure sensor from above, and that achieves a waterproof structure by compressing a waterproof packing disposed between one surface of the pressure sensor and the cover (for example, see Patent Document 1).

As a pressure sensor incorporated into a portable device having a waterproof function as described in Patent Document 1, a pressure sensor is known in which a lead portion is protruded from a side of a base and is bent into a U-shape, and is disposed so as to be along a side surface and a lower surface (for example, see Patent Document 2).

PRIOR ART DOCUMENTS

Patent Documents

[Patent Document 1] Japanese Unexamined Patent Application, First Publication No. 2008-180898
[Patent Document 2] Japanese Unexamined Patent Application, First Publication No. H10-200361

DISCLOSURE OF INVENTION

Problems to be Solved by the Invention

In Patent Document 1, when compressing the waterproof packing, a pressure sensor is supported by the housing at a lower surface opposite to a side at which the waterproof packing is provided. The pressure sensor is solder-bonded to a print circuit board at the lead portion at the lower surface of the substrate.

Conventionally, when a lead portion at a lower surface of the pressure sensor and a circuit board are soldered, at a lead portion of a lower surface of the base, solder may be excessively wet-spread. Due to the excessively wet-spread solder, a housing may not be able to stably support a lower surface of the pressure sensor. In addition, when the solder is wet-spread to the lead portion at a side portion of the pressure sensor, a lead at the side portion is in contact with a housing, and the electrical characteristics of the pressure sensor become unstable.

The present invention has been made in view of the above problems, and is to provide a pressure sensor in which failures caused by the wet-spread solder is suppressed by controlling the solder wet-spreading.

MEANS FOR SOLVING THE PROBLEMS

A first aspect of the present invention is a pressure sensor that includes a base including an accommodation portion, a pressure sensor element disposed in the accommodation portion, and a lead portion electrically-connected to the pressure sensor element, including a terminal portion provided along a lower surface of the base, and being exposed to an outside of the base. The terminal portion includes a recessed groove portion provided on a second surface which is an opposite surface of a first surface facing the body. The recessed groove portion divides at the second surface, a first region including a tip of the terminal portion and a second region next to the first region and away from the tip of the terminal portion.

According to the first aspect described above, when a first region of the terminal portion is solder-bonded, wet-spreading of the melted solder is suppressed by an edge of the recessed groove portion and the solder is prevented from spreading to the second region. Therefore, it is possible to provide stable solder-bonding, and failures caused by the wet-spread solder are suppressed.

In addition, when the pressure sensor is accommodated in a housing and a packing is disposed on the upper surface of the substrate to realize a waterproof structure, by supporting a portion overlapping the second region at the bottom side of the base, the support does not become unstable. Therefore, it is possible to realize a reliable waterproof structure by uniformly compressing the packing.

In a second aspect of the present invention according to the pressure sensor of the first aspect described above, the base may include a recess portion at the lower surface, and the recess portion may accommodate the terminal portion of the lead portion.

According to the second aspect described above, when the pressure sensor is accommodated in the housing, since the recess portion in which the lead portion is accommodated is provided on the lower surface of the base, the pressure sensor can be supported on the lower surface without applying load to the lead portion. At the terminal portion of the lead portion, since the wetting spread of the solder to the second region of the terminal portion is reduced by the recessed groove portion, by supporting the portion overlapping with the second region, stable support is possible.

In a third aspect of the present invention according to the pressure sensor of the first or the second aspect described above, the recessed groove portion may be formed intermittently.

According to the third aspect described above, even in a gap between the recessed groove portions, in which the recessed groove portion is not formed, the recessed groove portion which is formed intermittently can reduce wet-spreading of the solder due to a surface tension generated in the recessed groove portion, in addition, since the recessed groove portion is formed intermittently, the strength of the terminal portion can be increased.

In a fourth aspect of the present invention according to the pressure sensor of any one of the first to the third aspects described above, a depth of the recessed groove portion may be 1/20-1/2 of a thickness of the lead portion.

According to the fourth aspect described above, by setting the depth of the recessed groove portion to 1/20 or more and 1/2 or less of the thickness of the lead portion, it is possible to suppress wet-spreading of the solder and to secure the strength of the terminal portion, and therefore, breakage of the lead portion can be suppressed.

In a fifth aspect of the present invention according to the pressure sensor of any one of the first to the fourth aspects described above, a shape of a cross-section of the recessed groove portion may be an arc shape.

According to the fifth aspect described above, since the cross-sectional shape of the recessed groove portion is an arc shape, it is possible to reduce the stress concentration at the terminal portion where the recessed groove portion is formed and to suppress the decrease in strength of the terminal portion due to the recessed groove portion. In addition, the arcuate recessed groove portion can be easily formed by etching, and the manufacturing costs can be reduced.

A sixth aspect of the present invention is a pressure sensor module that may include a pressure sensor according to any one of the first to the fifth aspects, and a circuit board comprising a pad for solder mounting, where the first region of the terminal portion and the pad of the circuit board may be solder-bonded.

According to the sixth aspect described above, by a stable solder-bonding, it is possible to provide a pressure sensor module in which defects caused by wet-spreading of the solder are suppressed by stable solder bonding.

In a seventh aspect of the present invention according to the pressure sensor module of the sixth aspect described above, in a plan view viewed from a direction perpendicular to the first region of the terminal portion, an edge of the recessed groove portion at the first region may be positioned within a range of ±500 μm with respect to a peripheral edge of the pad of the circuit board.

According to the seventh aspect described above, by setting the displacement of the pad of the circuit board and the first region to be ±500 μm or less, the pressure sensor module in which the displacement between the solder bond regions is small and the solder is reliably bonded can be provided.

In an eighth aspect of the present invention according to the pressure sensor module of the sixth or the seven aspect described above, the pressure sensor module may include a housing comprising a storage portion in which the pressure sensor is stored, and be provided with a terminal-connection hole at a lower surface of the storage portion that connects the circuit board and the terminal portion of the pressure sensor, and a lid body covering the storage portion from above the pressure sensor. A seal body may be provided between the pressure sensor and the lid body. A lower surface of the housing may support the lower surface of the pressure sensor, and the seal portion may be sandwiched between the lid body and an upper surface of the pressure sensor.

According to the eighth aspect described above, it is possible to provide a pressure sensor module that achieves a waterproof structure.

EFFECTS OF THE INVENTION

According to the aspects of the present invention described above, when soldering the first region of the terminal portion, wet-spreading of the melted solder is suppressed by the edge of the recessed groove portion, and the solder does not spread to the second region. Therefore, stable solder bonding can be performed, and defects due to solder spreading can be suppressed.

BRIEF DESCRIPTION OF THE DRAWINGS

FIG. 4 is a bottom view of a pressure sensor incorporated in the pressure sensor module shown in FIG. 3.

EMBODIMENTS FOR CARRYING OUT THE INVENTION

Figure 1A:
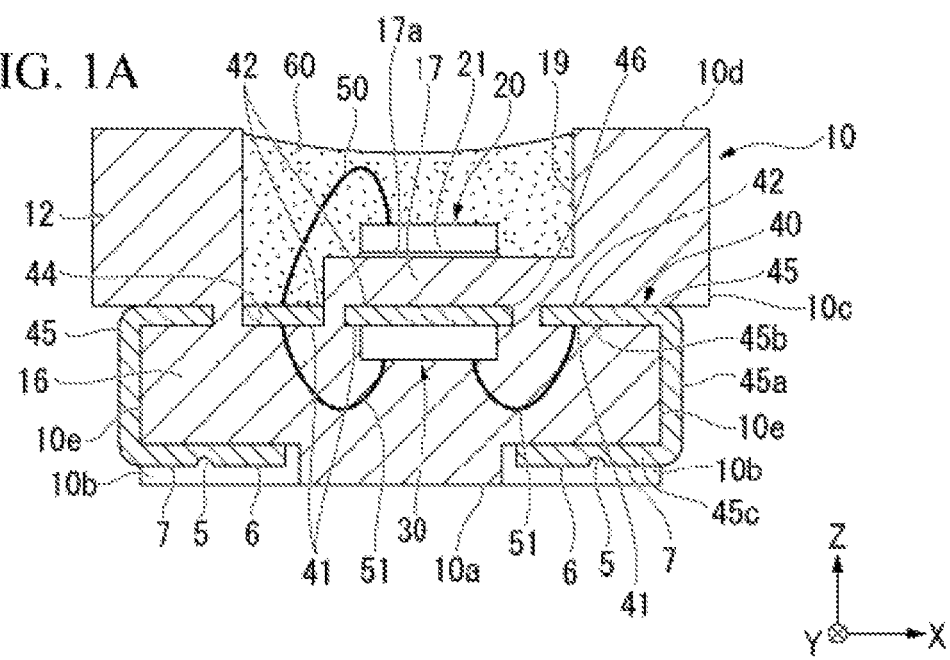
FIG. 1A is a schematic view of a pressure sensor of the first embodiment.

Hereinafter, embodiments are described with reference to the drawings.

Regarding the drawings used in the descriptions below, portions may be enlarged for convenience, and therefore, a size, a proportion and the like of each structural member are not necessarily the same as the ones of the actual members. In addition, portions may be omitted in the drawings.

An X-Y-Z coordinate system is shown each drawing as required. In the following description, to carry out each direction described with reference to this coordinate system as appropriate. In the descriptions below, each direction is described based on the coordinate system if needed.

First Embodiment

Figure 1B:
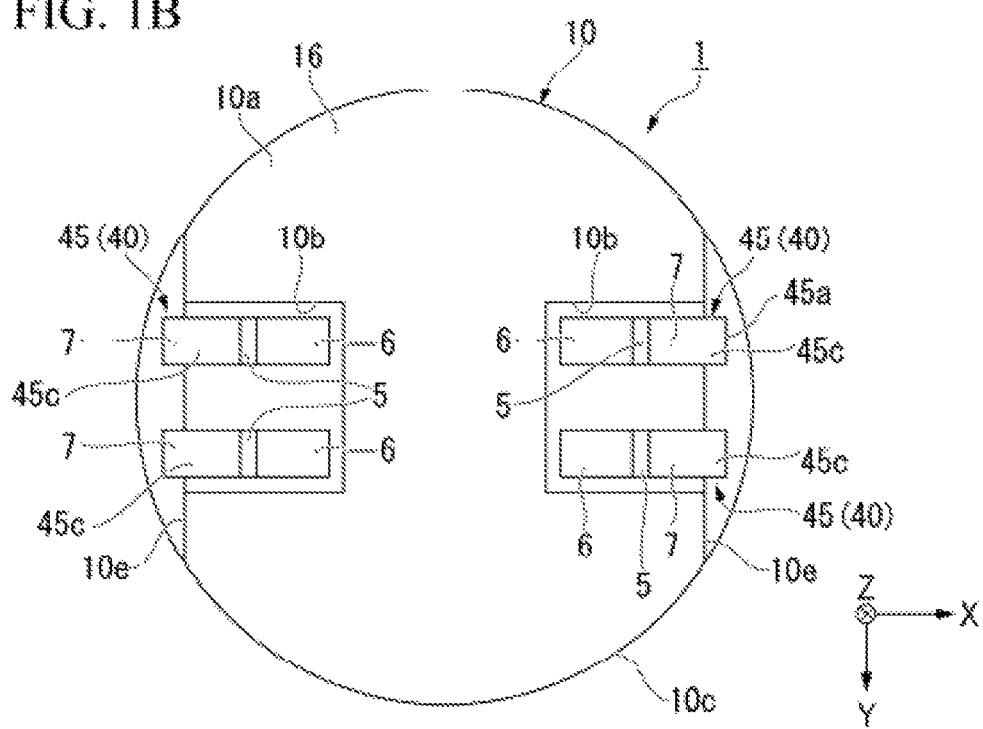
FIG. 1B is a bottom view viewed from below of the pressure sensor of FIG. 1.

FIG. 1A is a cross-sectional view of a pressure sensor 1 of the first embodiment. FIG. 1B is a bottom view of the pressure sensor 1. In the description of the pressure sensor 1 of the present embodiment, "upper" is a +Z direction and "below" is a −Z direction. A bottom view is a plan view viewing the pressure sensor 1 from below.

As shown in FIGS. 1A and 1B, the pressure sensor 1 of the present embodiment includes a pressure sensor element 20, a lead frame 40 which is electrically connected to the pressure sensor element 20, a base 10 which is made of a resin and supports the pressure sensor element 20 and the lead frame 40. Also, the pressure sensor 1 includes a control element 30.

In the base 10, the lead frame 40, the control element 30, and a bonding wire 51 are embedded in the resin of a base 10 and integrated. Thus, the lead frame 40, the control element 30, and the bonding wire 51 can be embedded, and can be protected by blocking these members from outside air and moisture. In addition, the base 10 includes a mounting portion 17 where the pressure sensor element 20 is mounted, and the pressure sensor element 20 is supported by the mounting portion 17.

A material of the base 10 is a resin of an engineering plastic and the like such as epoxy, polyphenylene sulfide resin (PPS), polybutylene terephthalate (PBT) and the like.

Young's modulus of a constituent resin of the base 10 is, for example, 1-50 GPa (preferably 10-30 GPa).

The base 10 includes a body portion 16 formed on the lower surface 41 of the lead frame 40 (−Z side with respect to the lead frame 40) and an annular wall portion 12 protruding annularly in the +Z direction from the main body portion 16. The main body portion 16 and the annular wall 12 are integrated.

The main body portion 16 of the base 10 and the annular wall 12 has a circular shape in a plan view; however, a shape thereof is not limited to this and can be any shape such as rectangular and other polygonal shape.

The annular wall 12 is formed in a cylindrical shape, and in a cylindrical inner space, an accommodation portion 19 in which the pressure sensor element 20 is accommodated is formed. In the accommodation portion 19, a protective agent 60 protecting the pressure sensor element 20 is filled.

At a portion of the lower surface of the storage portion 19, a mounting portion 17 extending as a portion of the base 10 is formed. The mounting portion 17 is formed on the upper surface 42 and is provided with a mounting surface 17a on which the pressure sensor element 20 is mounted.

At a portion which is a lower surface of the accommodation portion 19 and on which the mounting portion 17 is not formed, a portion (a land portion 44) of the lead frame 40 is exposed. The pressure sensor element 20 is electrically connected to the exposed lead frame 40 by the bonding wire 50.

The mounting portion 17 may be a member separate from the base 10. In this case, as a material constituting the mounting portion 17, it is preferable to select a material softer than a resin material constituting the base 10. Thus, the stress applied to the pressure sensor element 20 when the base 10 is deformed due to external force, moisture absorption, thermal expansion or the like is reduced, and it is possible to improve the measurement accuracy of the pressure sensor 1. In addition, if the mounting portion 17 described above is formed to be thicker, it is possible to reduce the influence of such stress and to increase the measurement accuracy more.

The base 10 includes an upper surface 10d as a surface constituting the periphery, a lower surface 10a, and a side surface 10c located between the upper surface 10d and the lower surface 10a. The lower surface 10a is a surface of a lower part of a main body portion 16, and the upper surface 10d is an end surface of an upper part of an annular wall portion 12. In addition, the side surface 10c is a surface formed on an outer periphery of the main body portion 16 and the annular wall portion 12.

The side surface 10c has a substantially circular shape in a plan view. In addition, at the side surface 110c, two flat surfaces 110e are provided. The flat surface 10e is a part of the side surface 10c and is provided on a side of the main body portion 16 of the base 10, The two flat surfaces 10e are disposed so as to be opposite to each other at the circular side surface 10c and are parallel to each other.

The lower surface 10a is a surface located at the body portion 16 of the body 10. The outer shape of the lower surface 10a is derived from a shape in a plan view of the flat surface 10e included in the side surfaces 10c, and the outer shape has a circular shape including two cut-out portions cut by straight lines.

At the lower surface 10a, two recess portions 10b are provided. The recess portions 10b are formed continuously from the flat surface 10e of the side surface 10c. In the recess portion 10b, the terminal portion 45c which is a portion of the lead portion 45 of the lead frame 40 is accommodated. In each of the recess portions 10b, a pair of terminal portions 45c is respectively accommodated. The recess portion 10b is formed to have a depth deeper than a thickness of the terminal portion 45c of the lead portion 45.

Since the recess portions 10b where the terminal portion 45c is respectively accommodated are provided at the lower surface 10a of the base 10, without adding a load to the terminal portion 45c, it is possible to support the pressure sensor 1 at the lower surface 10a of the base 10.

The lead frame 40 is a conductor and a plate-like body of 0.1-3 mm thick. In particular, in a small and thin electronic part which is integrated in mobile devices, a thin lead frame 40 is used that has a thickness of 0.1-0.3 mm. For example, it is possible to use a lead frame of 0.15 mm. The lead frame 40, except for a portion bent and exposed on the outside of the base 10, is disposed to be essentially parallel to the X-Y plane.

At the lower surface 41 of the lead frame 40, the control element 30 is installed. In addition, on the upper surface 42 which is an opposite surface of the lower surface 41 of the lead frame 40, a pressure sensor element 20 is disposed via the mounting portion 17 which is a portion of the base 10.

The lead frame 40 preferably includes a material which is excellent in thermal conductivity. Thus, it is possible to prevent overheating or excessive cooling of the pressure sensor element 20 and the control element 30. Therefore it is advantageous to stabilize the operation of the pressure sensor element 20 and the control element 30.

Such a material is preferably a metal such as copper (Cu) and iron (Fe).

The lead frame 40 includes a mounting portion 46 where the control element 30 is mounted, a land portion 44 electrically connected to the pressure sensor element 20 and the control element 30, a lead portion 45 formed along the side surface 10c and the lower surface 10a and exposed on the outside of the base 10 from a buried portion in the base 10. In the present embodiment, the lead frame 40 has four lead portions 45; however, the number of the lead portions 45 is not limited thereto.

On the lower surface 41 of the mounting portion 46, the control element 30 is mounted. Between the lower surface 41 of the mounting portion 46 and the control element 30, it is preferable to provide a stress relaxation layer (not shown). Thus, the stress applied to the control device 30 due to external force, moisture absorption, thermal expansion or the like is reduced.

The land portion 44 is electrically connected by the control element 30 and the bonding wire 51 at the lower surface 41. In addition, the land portion 44 is electrically connected by the pressure sensor element 20 and the bonding wire 50 at the upper surface 42.

The land portion 44 is provided as a relay terminal exchanging signals between the control element 30 and the pressure sensor element 20.

The lead portion 45 extends so as to be exposed from the flat surface 10e, which is a portion of the side surface 10c of the base 10, to the outside. The lead portion 45 includes, in order from the distal end side, a terminal portion 45c disposed along the lower surface 10a of the base 10, the relay portion 45a disposed along the side surface 10c of the base 10, the bonding portion 45b buried inside the base 10.

The lead portion 45 is electrically connected to the control element 30 via a bonding wire 51 at the bonding portion 45b. In addition, the lead unit 45 is solder-bonded to a pad 131 (see FIG. 3) of a circuit board 130 described below at a terminal portion 45c. Thus, the pressure sensor 1 is electrically connected to the circuit board 130 and an input and output of signals is performed. Each lead portion 45 is a terminal used for exchanging signals and power between the pressure sensor 1 and the outside, and is provided to correspond to, for example, a power supply terminal, a ground terminal, a signal input terminal, a signal output terminal and the like.

The lead portion 45 is formed so as to be bent downwardly as well as exposed from the tip of the bonding portion 45b to the outside of the base 10. Thus, the relay portion 45a extending along the flat surface 10e which is a portion of the side surface 10c of the base 10 is provided.

The terminal portion 45c is formed to be bent inward from the lower end of the relay unit 45a. The terminal portion 45c is accommodated in the recess portion 10b provided on the lower surface 10a of the base 10.

It is note that, in FIG. 1A, the relay portion 45a and the terminal portion 45c are shown to be in close contact with the base 10; however, the portions may be lifted from the base 10 without contacting the base 10. As shown in a manufacturing method described below, when performing bending of the lead portion 45 after molding the base 10, the relay portion 45a and the terminal portion 45c are lifted from the base 10 due to spring-back.

In the terminal portion 45c, a recessed groove portion 5 suppressing wet-spreading of the solder 8 (see FIG. 3) is provided on a surface opposite to the surface facing the base 10. The recessed groove portion 5 divides the terminal portion 45c into a first region 6 positioned at a distal end side and a second region 7 positioned at a side of the relay portion 45a and positioned away from the distal end side.

The first region 6 of the terminal portion 45c is solder-bonded to the pad 131 (see FIG. 3) of the circuit board 130. The recessed groove portion 5 suppresses wet-spreading of the solder 8 bonded to the first region 6 to the second region 7.

In addition, the cross-sectional shape of the recessed groove portion 5 in an arc shape. By making the cross-sectional shape of the recessed groove portion 5 arcuate, it is possible to suppress the stress concentration at the terminal portion 45c where the recessed groove portion 5 is formed and to suppress the decrease in the strength of the terminal portion 45c due to the recessed groove portion 5. The arcuate recessed groove portion 5 can be easily formed by half etching of the lead frame 40.

The depth of the recessed groove portion 5 is preferably 1/20 or more and 2/3 or less of the thickness of the lead portion 45. This makes it possible to reliably suppress wet-spreading of the solder before curing by the surface tension of the melted solder. In addition, the depth of the recessed groove portion 5 is more preferably 1/20 or more and 1/2 or less of the thickness of the lead portion 45. As a result, the wet-spreading of the solder can be reliably suppressed, and sufficient strength of the lead portion 45 can be secured.

For example, when the thickness of the lead portion 45 is 0.15 mm and the depth of the recessed groove portion 5 is set to be 0.0075 mm or more and 0.1 mm or less, wet-spreading of the solder can be reliably suppressed. It is more preferable when the depth be 0.0075 mm (7.5 μm) or more and 0.075 mm or less. As a result, wet-spreading of the solder can be reliably suppressed, and the strength of the lead portion 45 can be sufficiently secured.

The width of the recessed groove portion 5 can be approximately 100 μm. More specifically, it is preferably 50 μm or more and 200 μm or less. With such a configuration, the strength of the lead portion 445 can be secured, and the recessed groove 5 can be easily formed by half-etching.

The pressure sensor element 20 includes, for example, a diaphragm portion, a sealed space as a reference pressure chamber, and a plurality of strain gauges measuring a change in strain resistance of the diaphragm portion due to pressure are formed on one surface of a semiconductor substrate such a silicon. Each strain gauge is electrically connected to a different land portion 44 via a bonding wire 50.

When the diaphragm portion of the pressure sensor element 20 is deflected under pressure, stress corresponding to the strain amount of the diaphragm portion is generated in each strain gauge. The resistance value of the strain gauge changes in accordance with the stress, and a sensor signal corresponding to the change in the resistance value is output.

The pressure sensor element 20 is a pressure sensor element using Micro Electro-Mechanical Systems (MEMS) technology.

The pressure sensor element 20 is accommodated in the accommodating portion 19 of the base 10 and is fixed on the mounting portion 17. The pressure sensor element 20 can be adhered to the mounting portion 17 via a die bond 21. As the die bond 21, any one of an epoxy resin, a silicone resin, and a silver paste can be used.

The pressure sensor element 20 is provided on the upper surface 42 side (+Z side with respect to the lead frame 40) of the lead frame 40. In addition, the pressure sensor element 20 may be disposed at a position where a partial region or the whole region is out of the lead frame 40 viewed in a plan view.

The pressure sensor element 20 is connected to the land portion 44 of the lead frame 40 via a bonding wire 50 connected to a surface opposite to the surface facing the mounting portion 17.

As shown in FIG. 1A, the protective agent 60 is filled in the accommodating portion 19 to cover the pressure sensor element 20, and to shield and protect the pressure sensor element 20 from the outside air and moisture.

As the protective agent 60, for example, a silicone resin or a fluorine resin can be used. The protective agent 60 can be in a liquid state or a gel state. It is preferable that the protective agent 60 has a high viscosity.

As the protective agent 60, for example, it is desirable to use a soft gel agent having a hardness of less than 1 (type A hardness, in accordance with JIS K 6253). As a result, since the pressure applied from the object to be measured can be transmitted to the pressure sensor element 20, the accuracy of pressure detection by the pressure sensor element 20 is not decreased. In addition, the influence of deformation of the base 10 can be suppressed from being transmitted to the pressure sensor element 20 through the protective agent 60. The protective agent 60 protects the pressure sensor element 20 from intrusion of water and the outside air and prevents adverse effects on the pressure sensor element 20.

The above-described protective agent 60 is formed in a recessed shape such that the pressure receiving surface 60a, which is the surface thereof, is recessed downward. The pressure sensor 1 measures the pressure of a measurement medium (water, air, or the like) in contact with the pressure receiving surface 60a of the protective agent 60.

A protective agent 60 preferably has a low light transmittance and blocks the visible light or ultraviolet light. Thus, it is possible to prevent deterioration of the pressure sensor element 20. The protective agent 60 can include a pigment and the like to lower optical transparency.

The control element 30 is for example, an integrated circuit (IC). The control element 30 has a rectangular shape in a plan view. The control element 30 is disposed at the mounting portion 46 and the lower surface 41 of the lead frame 40. The control element 30 is provided at a position at least partially overlapping the pressure sensor element 20 viewed in a plan view. By disposing the control element 30 and the pressure sensor element 20 so as to overlap viewed in a plan view in this manner, the pressure sensor 1 can be downsized.

A circuit of the control element 30 is connected to the land portion 44 and the lead portion 45 of the lead frame 40 through the bonding wire 51 connected to a surface which is an opposite surface facing the lead frame 40.

When a sensor signal from the pressure sensor element 20 is input, the control element 30 processes the sensor signal and outputs the signal as a pressure detection signal. The sensor signal from the pressure sensor element 20 is input to the control device 30 through the bonding wire 50, the land portion 44, and the bonding wire 51.

The control element 30 includes a temperature sensor measuring an external temperature, an A/D converter for A/D converting a signal from the temperature sensor and outputting the signal as a temperature signal, and an arithmetic processing portion to which the temperature signal is input. The arithmetic processing portion can perform a correction processing on the sensor signal from the pressure sensor element 20 based on the temperature signal. As the temperature sensor, a resistance type (bride resistance type), a diode type, a thermocouple type, an infrared type or the like can be employed. By incorporating the temperature sensor, the control element 30 can correct the pressure detection signal according to the temperature in the system. Therefore, a highly accurate pressure measurement is possible.

Next, an example of a method of manufacturing the pressure sensor 1 is described with reference to FIGS. 2A to 2D.

(Mount of Control Element)

Figure 2A:
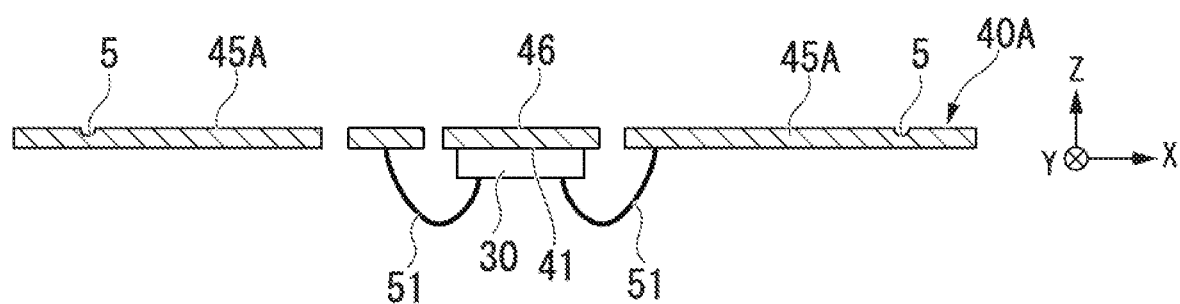
FIG. 2A is a process drawing showing an example of a method of manufacturing a pressure sensor according to the first embodiment, and showing a state in which a control element is mounted on a lead frame substrate.

First, as shown in FIG. 2A, a lead frame substrate 40A is prepared. The lead frame substrate 40A has the same configuration as the lead frame 40 except that the lead portion 45A is not bent.

The lead portion 45A of the lead frame substrate 40A is formed linearly over the entire length along the X axis direction. The outer shape of the lead frame substrate 40A is formed by etching. In addition, the outer shape of the lead frame substrate 40A may be formed using a shearing processing by press working. On the upper surface (surface on the +Z side) of the lead portion 45A of the lead frame substrate 40A, a recessed groove portion 5 is provided in advance. The recessed groove portion 5 can be formed by etching (half etching). As a result, a sharp edge 5a (see FIGS. 5A and 5B) is formed at the boundary between the recessed groove portion 5 and the first region 6, and the effect of suppressing wet-spreading of the solder due to the surface tension can be enhanced. In addition, the recessed groove portion 5 may be formed by photolithography or by machining.

Next, the control element 30 is installed on the lower surface 41 of the mounting portion 46 of the lead frame substrate 40A. Furthermore, the control element 30 and the lead portion 45A are connected to each other by the bonding wires 51.

Figure 2B:
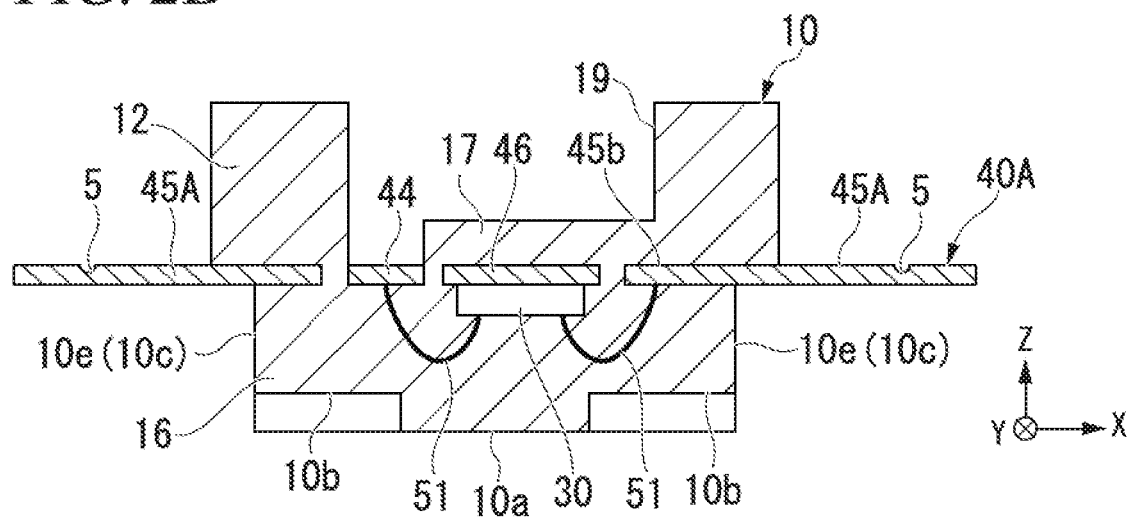
FIG. 2B is a view showing a state in which a substrate is molded.

As shown in FIG. 2B, the base 10 is formed so as to cover the control element 30, the bonding wire 51, and a portion of the lead frame substrate 40A (in particular, the mounting portion 46 and the bonding portion 45b of the lead portion 45A). The base 10 is formed by insert molding integrally forming the control element 30, the bonding wire 51, and a portion of the lead frame substrate 40A. The base 10 is formed by sandwiching the lead frame substrate 40A in a state where the control element 30 is mounted on the mounting portion 46 between the molds and convoluting the resin material in the space between the molds. The lead frame substrate 40A is buried in the base 10 in a state where portions corresponding to the relay portion 45a and the terminal portion 45c of the lead portion 45A are exposed from the base 10.

Figure 2C:
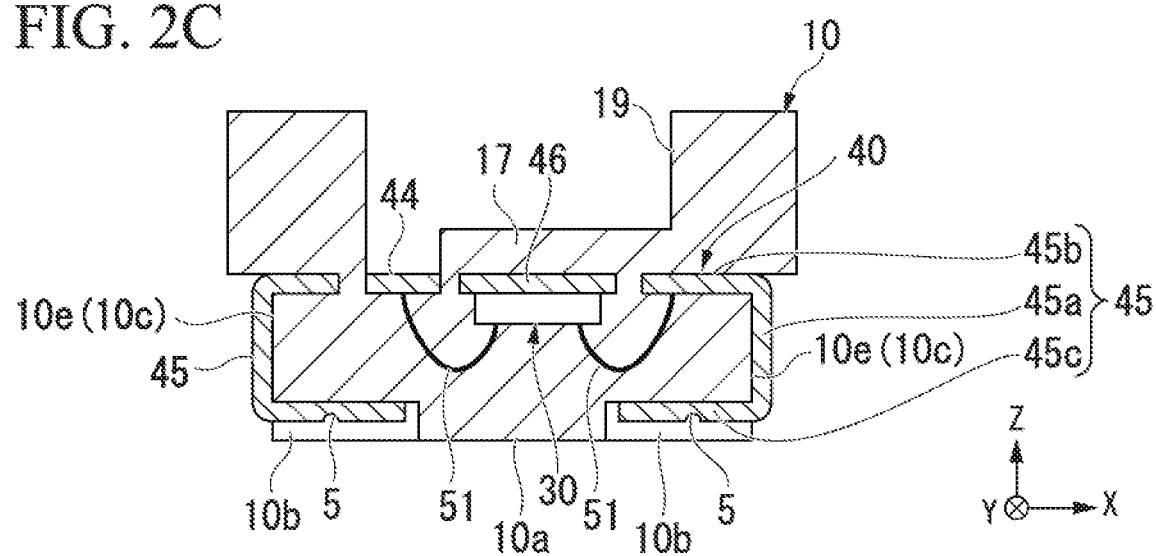
FIG. 2C is a view showing a state in which a lead frame base is bent.

As shown, in FIG. 2C, bending is carried out to bend the lead portion 45A protruding from the side surface 10c of the base 10 at two positions so as to be along the side surfaces 10c and the lower surface 10a. By the bending, the relay portion 45a is formed on the root side of the lead portion 45A exposed by protruding from the base 10. The relay portion 45a is arranged along the flat surface 10e which is a portion of the side surface 10c of the base 10. In addition, the terminal portion 45c is formed on the tip side of the lead portion 45A by bending. The terminal portion 45c is accommodated in a recess portion 10b provided on the lower surface 10a of the base 10.

Due to the bending of the lead portion 45A, fine metal particles may be generated from a bent portion. Since the control element 30 is covered by the base 10, the metal particles do not adhere to the control element 30, and due to the fine metal particles, failures of the control element 30 is suppressed.

Figure 2D:
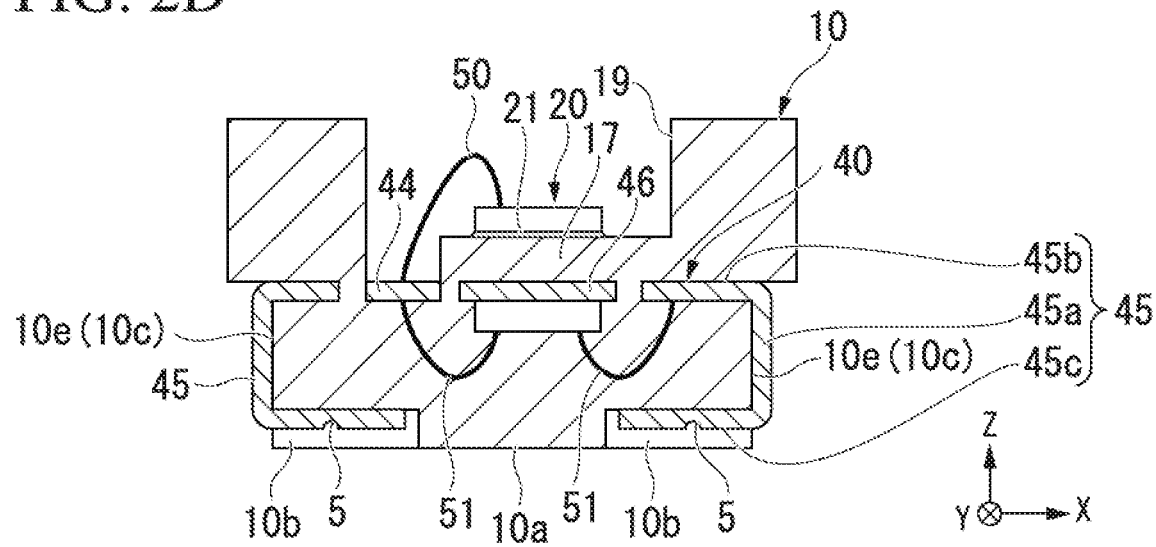
FIG. 2D is a view showing a state in which a pressure sensor element 20 is mounted.

Then, as shown in FIG. 2D, the pressure sensor element 20 is mounted on the mounting portion 17 of the base 10. The pressure sensor element 20 is adhered to the mounting portion 17 through die-bond 21. Furthermore, the pressure sensor element 20 and the lead frame 40 are connected to each other by the bonding wire 50.

Next, as shown in FIG. 1A, the accommodating portion 19 of the base 10 is filled with the protective agent 60 to cover the pressure sensor element 20.

Through the above steps, the pressure sensor 1 shown in FIG. 1A is obtained.

Figure 3:
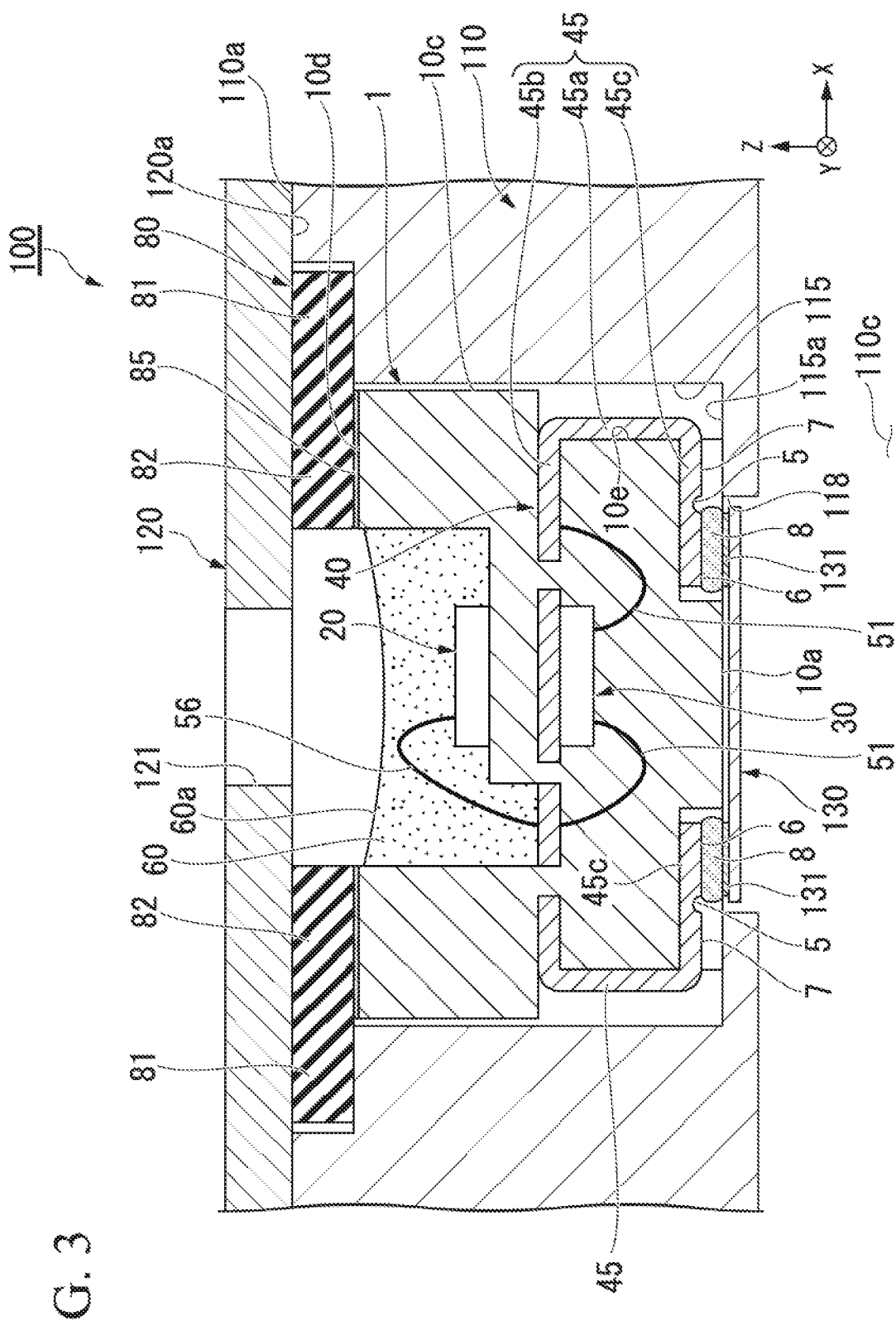
FIG. 3 is a schematic sectional view of a pressure sensor module incorporating a pressure sensor according to a first embodiment.

FIG. 3 is a schematic cross-sectional view of the pressure sensor module 100. The pressure sensor module 100 in which the pressure sensor 1 is incorporated is described with reference to FIG. 3 as an example of the use of the above-described pressure sensor 1.

Regarding the incorporation of the pressure sensor module 100, the pressure sensor 1 is provided with a seal body 80 which integrally provided on the upper surface of the base 10.

The pressure sensor module 100 includes the pressure sensor 1 provided on the seal body 80, a housing 110 including a storage portion 115 in which the pressure sensor 1 is stored, a lid body 120 covering the storage portion 115 from above the pressure sensor 1, and a circuit board 130 connected to the terminal portion 45c of the pressure sensor 2.

The pressure sensor module 100 has a structure such that while introducing a measuring medium (water, air, or the like) into a pressure receiving surface 60a formed on a surface of the protective agent 60 of the pressure sensor 1, preventing water from entering a housing interior 110c.

As shown in FIG. 3, the seal body 80 is a packing which is adhered and fixed to the upper surface 10d of the base 10 via an adhesive 85. The seal body 80 includes an overlap portion 82 overlaid on the upper surface 10d of the base 10 and fixed to the base 10, and a flange portion 81 integrally formed with the overlap portion 82 and disposed outside of the overlap portion 82.

As a material of the seal body 80, an acrylate-based resin, a silicone resin, rubber and the like can be employed. The seal body 80 has an elastic and function as a water-barrier member (seal member) by being pinched.

Young's modulus of the seal body 80 is preferably less than 1/10 of the Young's modulus of a constituent resin of the base 10 in order to function as a water-barrier member. For example, it is preferable that the Young's modulus of the seal body 80 is approximately 10 MPa.

The adhesive 85 is not particularly limited, but for example, the same material (for example, acrylate resin) constituting the seal body 80 in an uncured state can be applied and then be cured. The fixing of the seal body 80 and the base 10 at the overlapping portion 82 is not limited to being performed via the adhesive 85, but may be fixed to the base 10 by being integrally molded therewith.

The sealing body 80 is integrally fixed to the base 10, whereby it is possible to stop water between the sealing body 80 and the base 10. Here, "integrally" means that the seal body 80 and the base 10 are in a state of being fixed to each other without gaps therebetween.

As shown in FIG. 3, the housing 110 forms an outer shape of the pressure sensor module 100 into which the pressure sensor 1 is incorporated, and is provided to waterproof and protect the housing interior 110c. The material of the housing 110 is a stainless steel alloy, an aluminum alloy, a resin, or the like.

The housing 110 includes a mounting surface 110a which fixed the lid body 120 as one of a plurality of surface forming an outer shape. A thread hole which is not shown is provided in the mounting surface 110a, and the lid body 120 is fixed to the housing 110 with a fixing bolt which is not shown. In addition, on the mounting surface 110a, a storage portion 115 storing the pressure sensor 1 is provided.

A stepped portion 117 in which the flange portion 81 of the seal body 80 is accommodated is formed on the opening peripheral edge of the storage portion 115. The stepped portion 117 is formed slightly larger than the outer diameter of the flange portion 81. On the stepped portion 117, an opposing surface 117a is provided on the side facing the lid body 120. The opposing surface 117a is formed in flat so as to clamp the flange portion 81 of the seal body 80.

The storage portion 115 is formed slightly larger in size and in a plan view of the side surface 10c of the base 10 and can smoothly insert and accommodate the base 10 from above. The lower surface 115a of the storage portion 115 has a sufficient area to support the lower surface 10a of the base 10.

On the lower surface 115a of the storage portion 115, a terminal connection hole 118 penetrating to the housing interior 110c is provided. The terminal connection hole 118 is provided to open the lead portion 45 exposed from the lower surface 10a of the base 10 to the housing interior 110c. The terminal connection hole 118 is provided with a circuit board 130 soldered to the terminal portion 45c of the pressure sensor 1.

The kinds of the solder 8 is not particularly limited, and examples thereof include lead-free solder such as an Sn, a Sn—Pb-based alloy solder, a Sn—Ag-based alloy, a Sn—Bi-based alloy, a Sn—Cu-based alloy, a Sn—In-based alloy, eutectic solder, low-temperature solder, and the like. These solders can be used alone or in a combination of two or more.

FIG. 4 is a bottom view of the pressure sensor 1 assembled to the pressure sensor module 100. In FIG. 4, a terminal connection hole 118 provided in the lower surface 115a of the storage portion 115 is shown by the two-dot chain line.

As shown in FIG. 4, the terminal connection hole 118 is formed so as to surround the first region 6 of the terminal portions 45c of the pressure sensor 1 in a plan view. The first region 6 is a region which is solder-bonded to a circuit board 120. Thus, the terminal connection hole 118 opens the first region 6 to be solder-bonded. In addition, the lower surface 115a of the storage portion 115 overlaps with the second region 7 of the terminal portion 45c in a plan view, and does not overlap with the first region 6. That is, at a lower surface 10a of the body 10, the lower surface 115a does not support an area where the solder 8 is formed.

As shown in FIG. 3, the lid body 120 is a flat plate disposed so as to face the mounting surface 110a of the housing 110. The lid body 120 is bolt-fixed to the mounting surface 110a of the housing 110 so as to cover the storage portion 115 from above the pressure sensor 1 (not shown). In the lid body 120, a pressure introducing hole 121 introducing a measuring medium (water, air, or the like) to the pressure sensor 1 is provided. In addition, the lid body 120 has a flat lower surface 120a facing the housing 110. The lower surface 120a is in contact with the mounting surface 110a of the housing 110.

The lid body 120 is formed of, for example, a stainless steel alloy, an aluminum alloy, a resin or the like.

The circuit board 130 is a print wiring board such as a printed circuit board (PCB) and Flexible Printed Circuit (FPC). On a surface, the circuit board 130 includes a pad 131 for solder mounted. The pad 131 is disposed so as to face lower surface 10a of the pressure sensor 1.

In FIG. 4, a positional relationship between the pads 131 of the circuit board 130 is shown by a two-dot chain line.

As shown in FIG. 4, the pad 131 is arranged so as to overlap the first region 6 of the terminal portion 45c of the pressure sensor 1 in a plan view (that is, as viewed from a direction orthogonal to the first region 6 of the terminal portion 45c). The edge 5a of the recessed groove portion 5 on the side of the first region 6 of the terminal portion 45c and the peripheral edge of the pad 131 allow displacement of the distance H. The distance H is preferably 500 µm or less. Since the displacement between the pad 131 and the first region 6 is ±500 µm or less, it is possible to reduce the displacement between the regions bonded via the solder 8 and securely bond the regions by the solder 8.

Figure 5A:
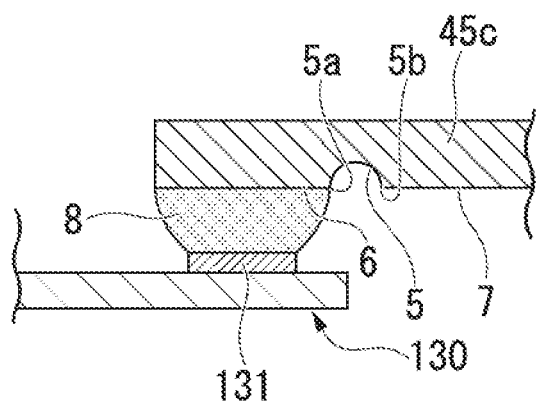
FIG. 5A is a schematic view showing a state of solder-bonding a terminal portion of a pressure sensor and a pad of a circuit board in the pressure sensor module shown in FIG. 3.
Figure 5B:
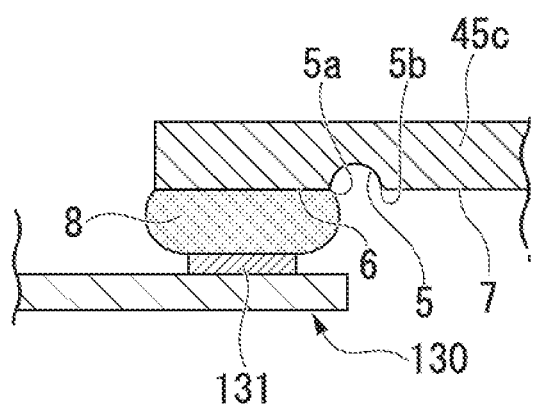
FIG. 5B is a schematic view showing a state of solder-bonding a terminal portion of a pressure sensor and a pad of a circuit board in the pressure sensor module shown in FIG. 3.

FIGS. 5A and 5B are schematic views showing a state of the solder 8 bonding the terminal portion 45c of the pressure sensor 1 and the pad 131 of the circuit board 120. When the amount of the solder 8 is relatively small, as shown in FIG.

5A, the solder 8 is formed so as to spread from the pad 131 side toward the terminal part 45c (or from the terminal part 45c toward the pad 131). On the other hand, when the amount of the solder 8 is relatively large, as shown in FIG. 5B, the solder 8 has a shape bulging outward. In either case, the solder 8 is prevented from wet-spreading from the first region 6 to the second region 7 at the edge 5a of the recessed groove portion 5.

When the amount of the solder is much larger that as shown in FIG. 5B, the surface tension at the edge 5a of the first region 6 of the recessed groove portion 5 is broken, and the molten solder 8 flows into the recessed groove portion 5. In this case, at the edge 5b of the second region 7 of the recessed groove portion 5, the wet-spreading of the solder is further suppressed by surface tension. Therefore, by forming the recessed groove portion 5, even when the amount of the solder 8 is large, the wet-spreading of the solder to the second region 7 can be suppressed.

Figure 6:
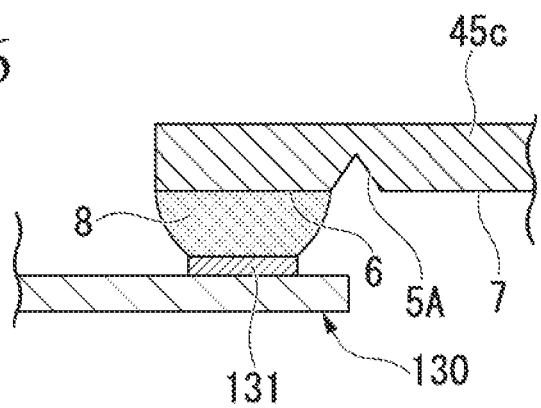
FIG. 6 is a schematic view showing a recessed groove portion that can be adopted in the pressure sensor of the first embodiment.
Figure 7:
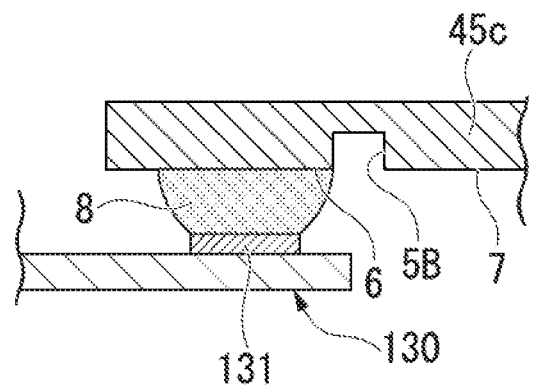
FIG. 7 is a schematic view showing a recessed groove portion that can be adopted in the pressure sensor of the first embodiment.

The pressure sensor 1 of the present embodiment includes a recessed groove portion 5 whose cross-sectional shape is an arc shape. However, the cross-sectional shape of the recessed groove portion is not limited to this. FIGS. 6 and 7 show recessed groove portions 5A and 5B that can be adopted in the present embodiment.

The recessed groove portion 5A shown in FIG. 6 is a V-shaped groove having a V-shaped cross-sectional shape. The recessed groove portion 5B in FIG. 7 is a rectangular groove. Even when the recessed groove portions 5A and 5B are employed, similarly to the recessed groove portion 5 of the present embodiment, it is possible to suppress the wet-spreading of the solder.

According to the pressure sensor 1 of the present embodiment, when solder-bonding the first region 6 of the terminal portion 45c, it is possible to suppress wet-spreading of the solder 8 in a molten state by an edge 5a of the recessed groove portion 5, and the solder 8 does not spread into the second region 7. Therefore, stable bonding using solder 8 becomes possible.

In addition, since the recessed groove portion 5 is provided, the solder 8 does not wet-spread on the relay portion 45a continuously extending upward from the second region 7 of the terminal portion 45c. There is no concern that the outer shape of the pressure sensor 1 is increased by the thickness of the wet-spread solder 8 and the outer dimension can be set as designed. Therefore, the pressure sensor 1 can be smoothly accommodated in the storage portion 115 of the housing 110. In addition, the contact between the inner wall surface of the storage portion 115 of the housing 110 and the relay portion 45a can be suppressed, and electrical instability is not caused.

In the pressure sensor module 100 of the present embodiment, the lower surface 115a of the storage portion 115 of the housing 110 supports the pressure sensor 1. The lower surface 115a supports a portion which overlaps with the second area 7 of the terminal portion 45c in a plan view. In the second region 7, since there is no wet-spreading of the solder 8, a thickness is not increased due to the solder 8. Therefore, the second region 7 does not protrude lower than the lower surface 10a from the recess portion 10b provided on the lower surface 10a of the base 10. This makes it possible to stably support the pressure sensor 1 on the lower surface 115a of the storage portion 115. Furthermore, it is possible to uniformly compress the overlap portion 82 of the seal body 80 provided on the upper surface 10d side of the base 10.

In the pressure sensor module 100 of the present embodiment, the pressure sensor 1 is stored in the storage portion 115 of the housing 110, and the seal body 80 is covered with the lid body 120 from above to compress the seal body 80, thereby the waterproof structure that does not allow water invasion into the housing interior 110c is realized.

The flange portion 81 of the seal body 80 is sandwiched between the opposing surface 117a of the step portion 117 and the lower surface 120a of the lid body 120 and is compressed. The seal body 80 of the pressure sensor 1 is integrally formed with the base 10, and a gap between the upper surface 10d of the base 10 and the overlap portion 82 of the seal member 80 is water-stopped.

Therefore, according to the pressure sensor module 100, it is possible to prevent the water which enters from the pressure introducing hole 121 of the lid body 120 as well as water which enters from a gap between the lower surface 120a of the lid body 120 and a housing 110, from entering the housing interior 110c.

In addition, the overlapping portion 82 of the seal body 80 and the base 10 are sandwiched between the lower surface 115a of the storage portion 115 and the lower surface 120a of the lid body 120 to be compressed. In the pressure sensor module 100, since waterproofing is secured by compression of the flange portion 81, the overlapping portion 82 does not necessarily have to be compressed to a degree required for waterproofing. If the compression ratio of the overlap portion 82 is excessively increased, there is a possibility that the base 10 is deformed and affects the measurement of the pressure sensor element 20. Therefore, it is preferable that the compression of the overlap portion 82 is an appropriate compression to the extent that the displacement of the pressure sensor 1 in the storage portion 115 is reduced. Thereby, it is possible to provide the highly reliable pressure sensor module 100 suppressing the deformation of the base 10 while suppressing the displacement of the pressure sensor 1 inside the storage portion 115.

Second Embodiment

Then, the second embodiment is described.

Figure 8:
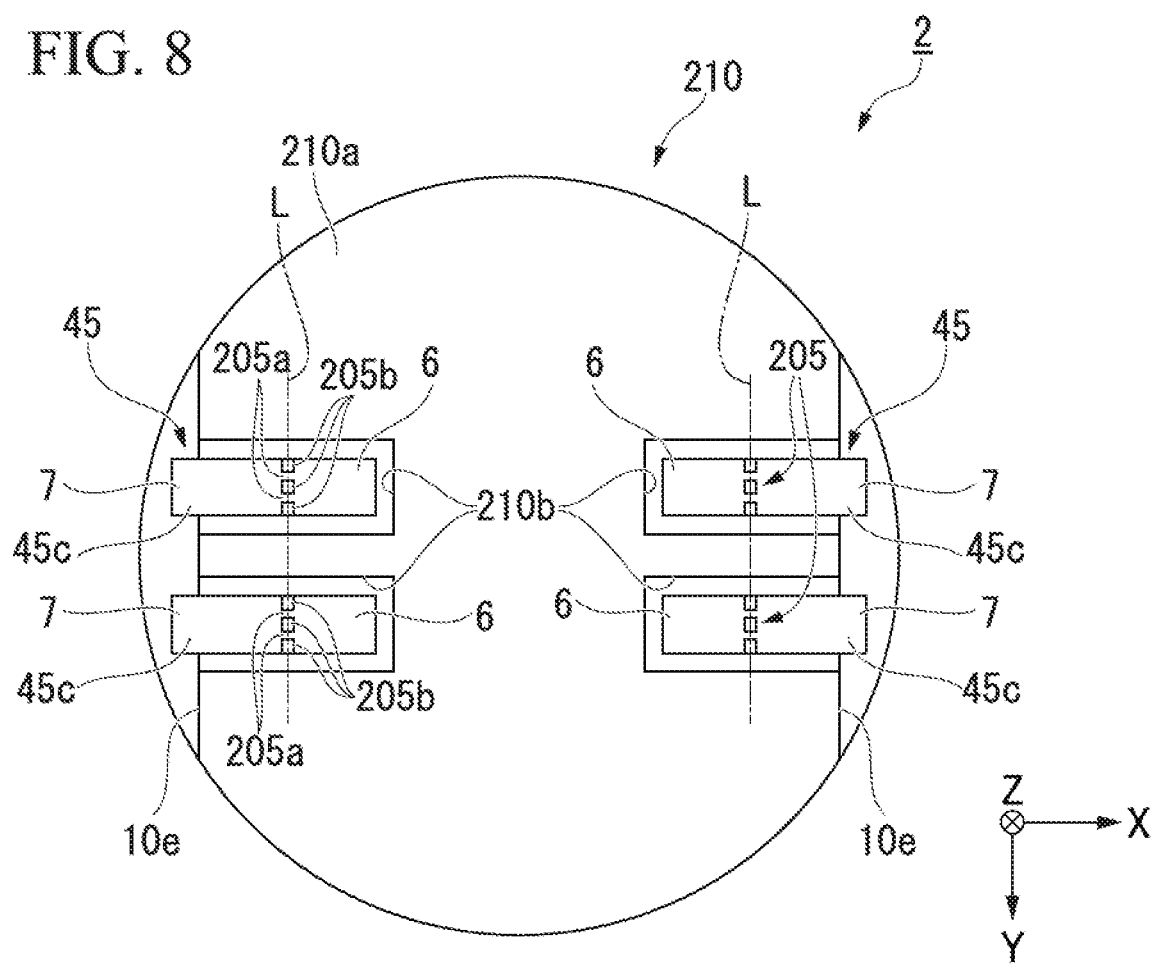
FIG. 8 is a bottom view of the pressure sensor of the second embodiment.

FIG. 8 is a bottom view of the pressure sensor 2 of the second embodiment and corresponds to FIG. 1B of the first embodiment.

In the pressure sensor 2 in the second embodiment, a recess portion 210b provided at a lower surface 210a of a base 210 has a different shape. Also, in the pressure sensor 2 of the second embodiment, the configuration of the recessed groove portion 205 provided at the terminal portion 45c is different.

The structural members which are the same as the first embodiment described above are denoted by the same reference numerals and descriptions thereof are omitted.

In a pressure sensor 2 of the second embodiment, a groove portion 205 is provided so as to correspond to each lead portion 45. The four lead portions 45 are accommodated in different recessed groove portions 205 on the lower surface 210a of the base 210. As a result, the adjacent lead portions 45 do not contact each other. Therefore, it is possible to more reliably prevent the short circuit between the lead portions 45.

In the pressure sensor 2 of the second embodiment, the recessed groove portion 205 is formed intermittently along a partition line L that divides the terminal portion 45c into the first region 6 and the second region 7.

The recessed groove portion 205 includes a plurality of short groove portions 205b. The short groove portion 205b is aligned along the partition line L. Between the adjacent short groove portions 205b, the inter-groove portion 205a is positioned. The inter-groove portion 205a is a flat surface continuing to the first region 6 and the second region 7.

Each of the short groove portions 205b aligned along the partition line L suppresses the solder 8 from wet-spreading to the second region 7 due to the surface tension. Although the inter-groove portion 205a between the short groove portions 205b is flat, due to the surface tension generated in the short groove portion 205b, the wet-spreading of the molten solder 8 from the inter-groove portion 205a to the second region 7 is suppressed.

It is preferable that the distance between the adjacent short groove portions 205b (that is, the length along the partition line L of the inter-groove portion 205a) is ⅓ or less of the length of the short groove portion 205b. Within the range, wet-spreading from the inter-groove portion 205a can be sufficiently suppressed by the surface tension generated in the short groove portion 205b.

According to the pressure sensor 2 of the second embodiment, it is possible to increase the strength of the terminal portion 45c by intermittently forming the recessed groove portion 205 and forming the inter-groove portion 205a between the adjacent short groove portions 205b.

While various embodiments of the present invention have been described above, the respective configurations and combinations thereof in the respective embodiments are merely examples, and additions, omissions, substitutions, and other changes in the configurations are possible without departing from the spirit of the present invention. In addition, the present invention is not limited by the embodiment.

For example, in the respective embodiments, the example in which the solder is bonded to the first region of the terminal portion has been described. However, a configuration such that the terminal portion is solder-bonded to the circuit substrate in the second region, and the recessed groove portion 5 suppress wet-spreading of solder to the first region 6 is possible.

In each of the embodiments, an example that the recessed groove portion extends linearly so as to be orthogonal to the extending direction of the terminal portion. However, the recessed groove portion does not necessarily have to extend linearly. For example, the recessed groove portion may extend along a shape of the terminal connection hole 118.

Description of the Reference Symbols 1, 2: pressure sensor
5, 5A, 5B, 205: recessed groove portion
5a, 5b: edge
6: first region
7: second region
8: solder
10, 210: base
10a, 210a: lower surface
10b, 210b: recess portion
10c: side surface
10d: upper surface
10e: flat surface
19: accommodation portion
20: pressure sensor element
30: control element
40: lead frame
40A: lead frame substrate
45, 45A: lead portion
45a: relay terminal
45b: bonding portion
45c: terminal portion
50, 51: bonding wire
60: protective agent
80: seal body
81: flange portion
82: overlap portion
100: pressure sensor module
110: housing
115: storage portion
115a: lower surface
117: step portion
118: terminal connection hole
120: lid body
121: pressure introducing hole
130: circuit board
131: pad
205a: inter-groove portion
H: distance

The invention claimed is:

1. A pressure sensor comprising:
a base comprising (i) an accommodation portion which is provided at an upper surface of the base and (ii) a recess portion provided at a lower surface of the base;
a pressure sensor element disposed in the accommodation portion; and
a lead portion electrically-connected to the pressure sensor element, comprising a terminal portion accommodated in the recess portion, provided along the lower surface of the base, and exposed to an outside of the base,
wherein the terminal portion comprises a first surface facing the lower surface of the base, a second surface which is an opposite surface located opposite to the first surface and a recessed groove portion provided on the second surface, and
wherein by the recessed groove portion, the terminal portion is divided into a first region comprising a tip of the terminal portion and a second region extending away from the tip of the terminal portion.

2. The pressure sensor according to claim 1, wherein the recessed groove portion is formed intermittently.

3. The pressure sensor according to claim 1, wherein a depth of the recessed groove portion is ¹⁄₂₀-½ of a thickness of the lead portion.

4. The pressure sensor according to claim 1, wherein a shape of a cross-section of the recessed groove portion is an arc shape.

5. The pressure sensor according to claim 1, wherein the lead portion comprises a relay portion extending along a portion of a side surface of the base and exposed to the outside of the base.

6. A pressure sensor module comprising:
a pressure sensor according to claim 1; and
a circuit board comprising a pad for solder mounting,
wherein the first region of the terminal portion and the pad of the circuit board are solder-bonded.

7. The pressure sensor module according to claim 6, in a plan view viewed from a direction perpendicular to the first region of the terminal portion, an edge of the recessed groove portion at the first region is positioned within a range of ±500 μm with respect to a peripheral edge of the pad of the circuit board.

8. The pressure sensor module according to claim 6, comprising:
a housing comprising a storage portion in which the pressure sensor is stored, and being provided with a terminal-connection hole at a lower surface of the storage portion that connects the circuit board and the terminal portion of the pressure sensor; and a lid body covering the storage portion from above the pressure sensor, wherein a seal body is provided between the pressure sensor and the lid body, wherein a lower surface of the housing supports the lower surface of the pressure sensor, and the seal portion is sandwiched between the lid body and an upper surface of the pressure sensor.

\* \* \* \* \*